United States Patent
Harkness

(10) Patent No.: US 10,740,513 B2
(45) Date of Patent: Aug. 11, 2020

(54) INTRA-INCREMENT ADJUSTMENTS OF IMPLICIT FINITE ELEMENT SIMULATION

(71) Applicant: Dassault Systèmes Simulia Corp., Providence, RI (US)

(72) Inventor: Harrington Hunter Harkness, Canton, MA (US)

(73) Assignee: Dassault Systèmes Simulia Corp., Johnston, RI (US)

( * ) Notice: Subject to any disclaimer, the term of this patent is extended or adjusted under 35 U.S.C. 154(b) by 288 days.

(21) Appl. No.: 14/136,783

(22) Filed: Dec. 20, 2013

(65) Prior Publication Data

US 2015/0178423 A1 Jun. 25, 2015

(51) Int. Cl.
*G06F 30/23* (2020.01)

(52) U.S. Cl.
CPC .................... *G06F 30/23* (2020.01)

(58) Field of Classification Search
None
See application file for complete search history.

(56) References Cited

U.S. PATENT DOCUMENTS

| | | | | |
|---|---|---|---|---|
| 5,379,227 A * | 1/1995 | Tang | ...................... | B21D 22/26 29/34 R |
| 7,386,428 B1 * | 6/2008 | Hallquist | ............ | G06F 17/5018 702/102 |
| 2002/0177983 A1 * | 11/2002 | Maker | ............................... | 703/2 |
| 2008/0275677 A1 * | 11/2008 | Landon | .............................. | 703/2 |
| 2009/0299702 A1 * | 12/2009 | Grimes et al. | .................... | 703/1 |
| 2011/0106459 A1 * | 5/2011 | Christ, Jr. | ............ | G01N 21/892 702/42 |

OTHER PUBLICATIONS

Dvorak, Buckling Analysis with FEA, Feb. 15, 2011, Machine Design.com, pp. 1-10 (Year: 2011).*

Zaera et al., An implicit consistent algorithm for the integration of thermoviscoplastic constitutive equations in adiabtic conditions and finite deformations, 2006, Elsevier, pp. 1594-1612 (Year: 2006).*

(Continued)

*Primary Examiner* — Omar F Fernandez Rivas
*Assistant Examiner* — Bernard E Cothran
(74) *Attorney, Agent, or Firm* — Hamilton, Brook, Smith & Reynolds, P.C.

(57) ABSTRACT

An embodiment of the invention involves increasing the penalty stiffness within a finite element simulation increment, which is more accurate because it avoids following a solution path with significant non-physical penetrations. An embodiment of the present invention begins by determining a first value of a parameter used by a finite element simulation of a load increment. Next, a first solution of the finite element simulation is determined by performing Newton iterations using the first value of the parameter until a first convergence check is satisfied. Then, a second value the parameter is determined wherein the second value of the parameter is unequal to the first value of the parameter. Finally, a second solution of the finite element simulation is determined by continuing the Newton iterations using the second value of the parameter until a second convergence check is satisfied, the first convergence check being different than the second convergence check.

20 Claims, 8 Drawing Sheets

(56) References Cited

OTHER PUBLICATIONS

Belytschko, Liu, and Moran, Wiley and Sons, Augmented Lagrangian method, p. 328 and 329 of *Nonlinear Finite Elements for Continua and Structures*, 2000.

French, Donald A., Larsson, Stig and Nochetto, Ricardo H., Pointwise a Posteriori Error Analysis for an Adaptive Penalty Finite Element Method for the Obstacle Problem, Sep. 17, 2000, pp. 1-20.

Rasheed, Khaled, An Adaptive Penalty Approach for Constrained Genetic-Algorithm Optimization, 1998, 7 pages.

Nie, Pu-yan, A Self-adaptive Penalty Approach for Nonlinear Programming, Applied Mathematics Research eXpress, Jan. 25, 2005, pp. 1-11.

"10.2 Enhanced convergence behavior for Abaqus/Standard contact analyses," Abaqus 6.13 Release Notes (Jul. 5, 2013), http://media.3ds.com/support/simulia/public/v613/release-notes/books/rnb/abc10aqs02.html. Retrieved from internet Feb. 20, 2014.

* cited by examiner

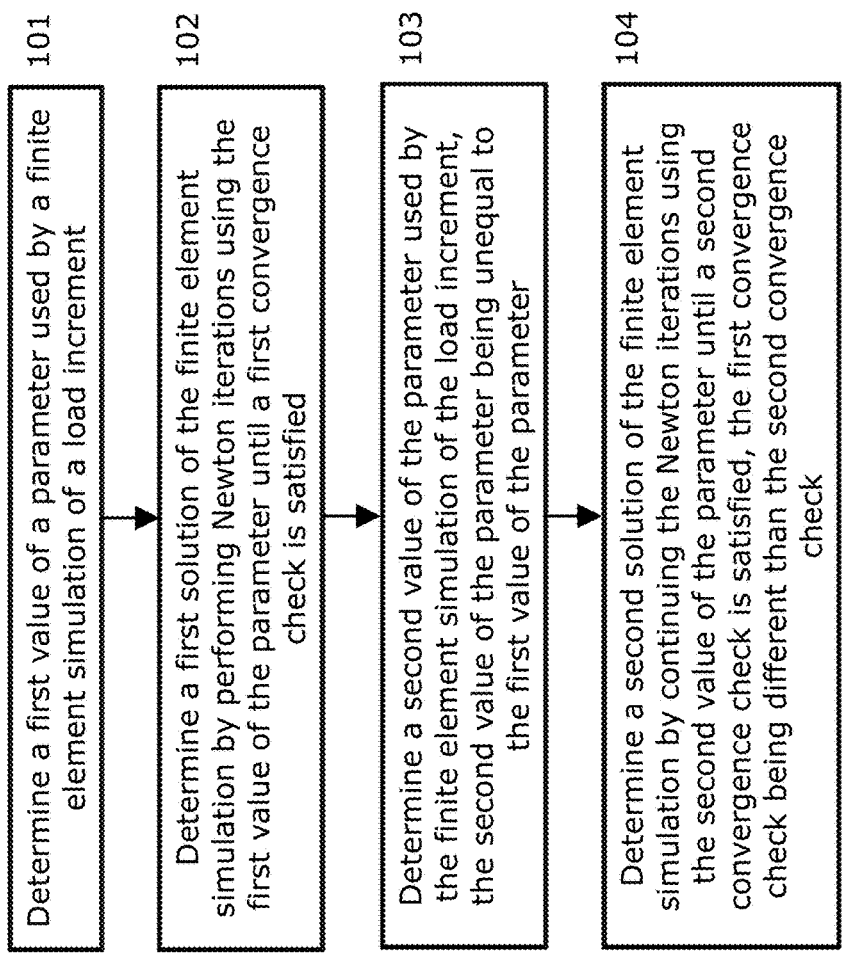
Figure: 1

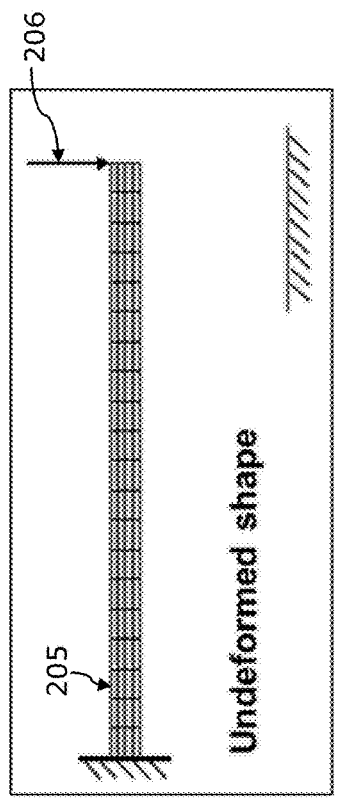
Figure: 2A
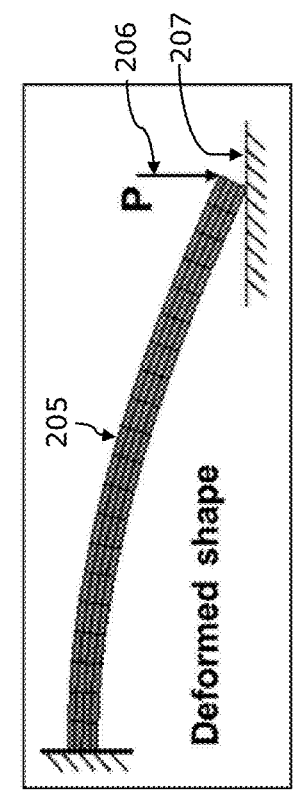
Figure: 2B
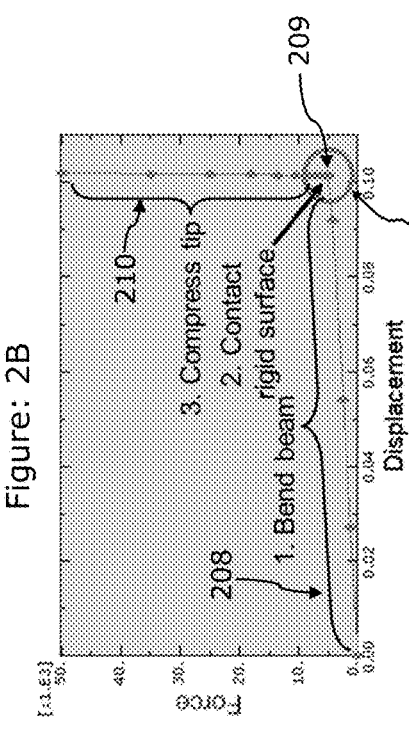
Figure: 2C

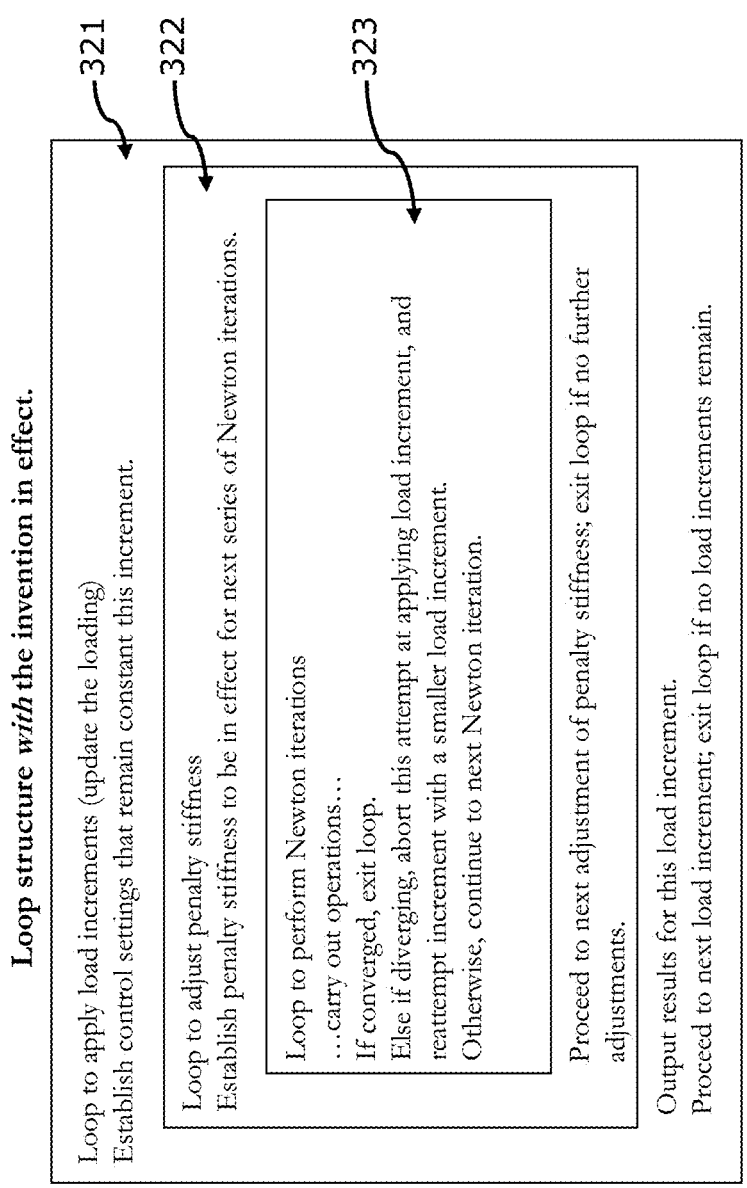
Figure: 3A

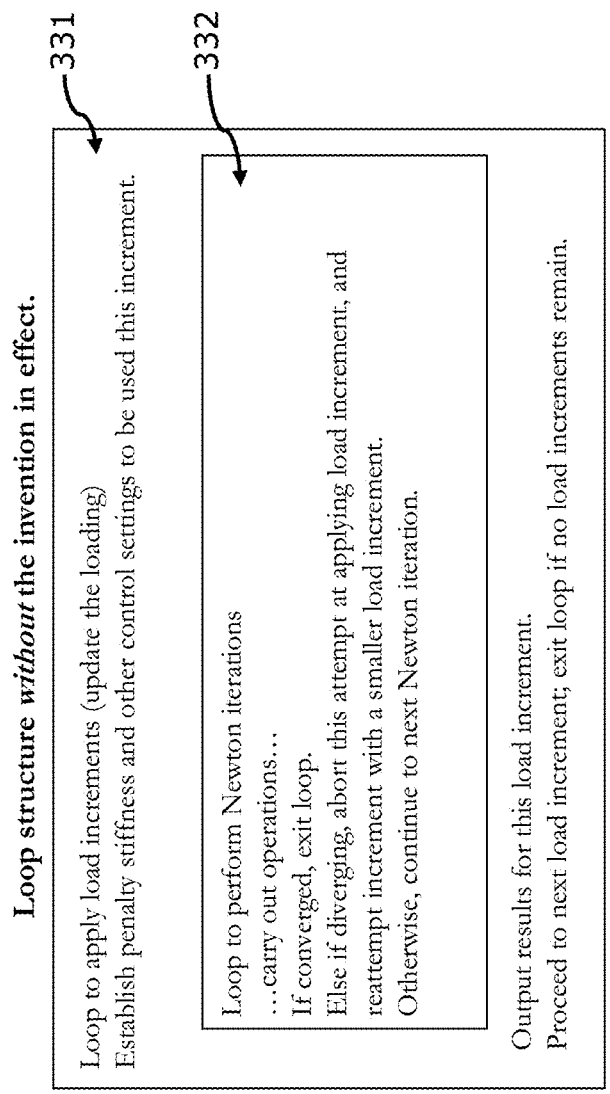
Figure: 3B

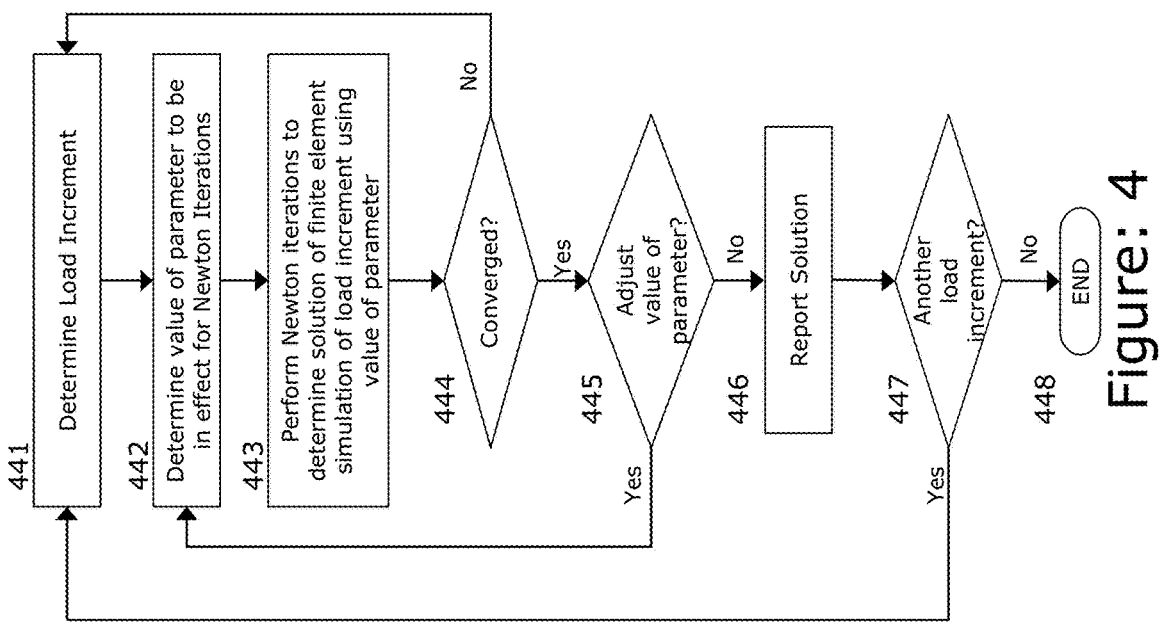
Figure: 4

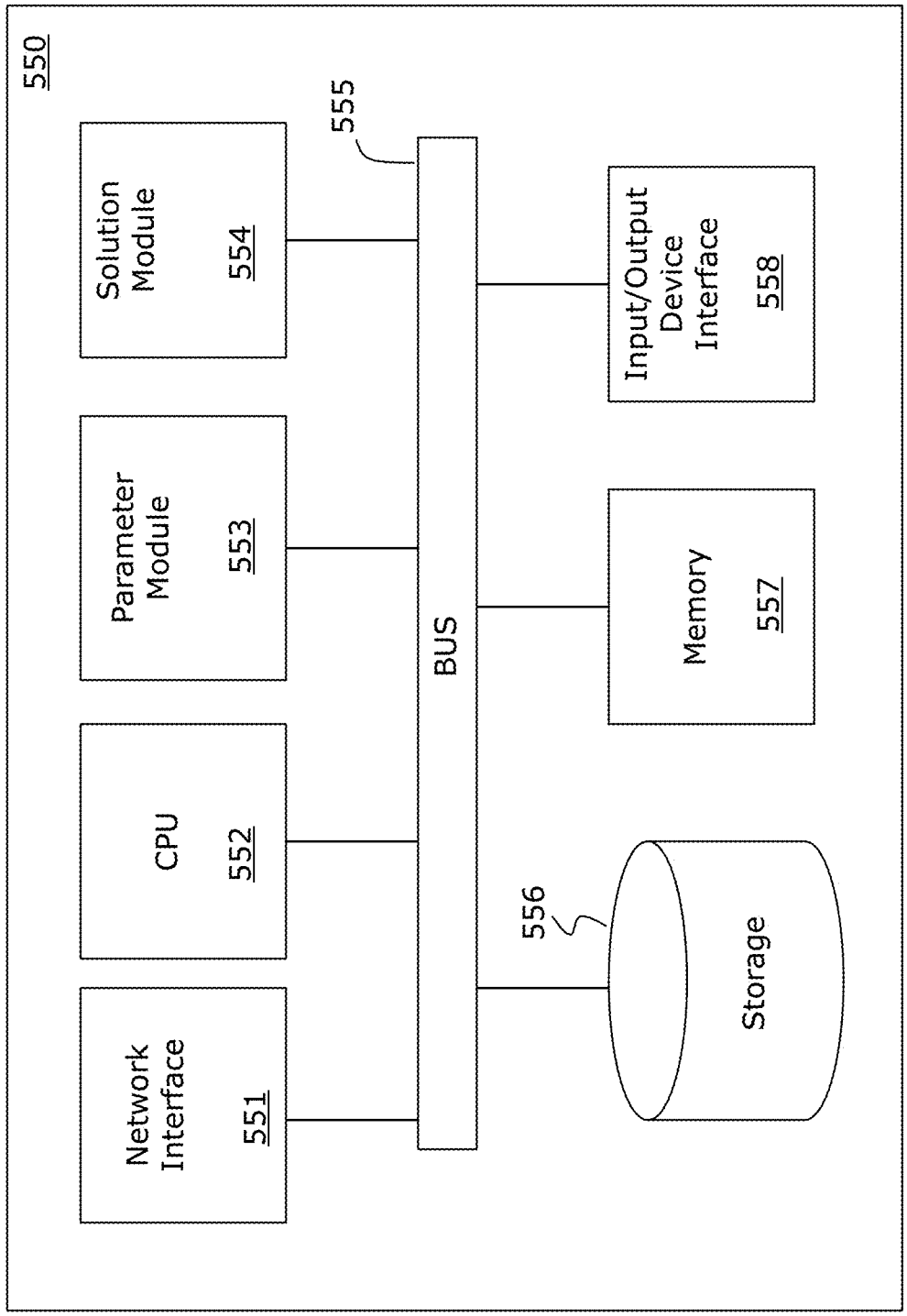
Figure: 5

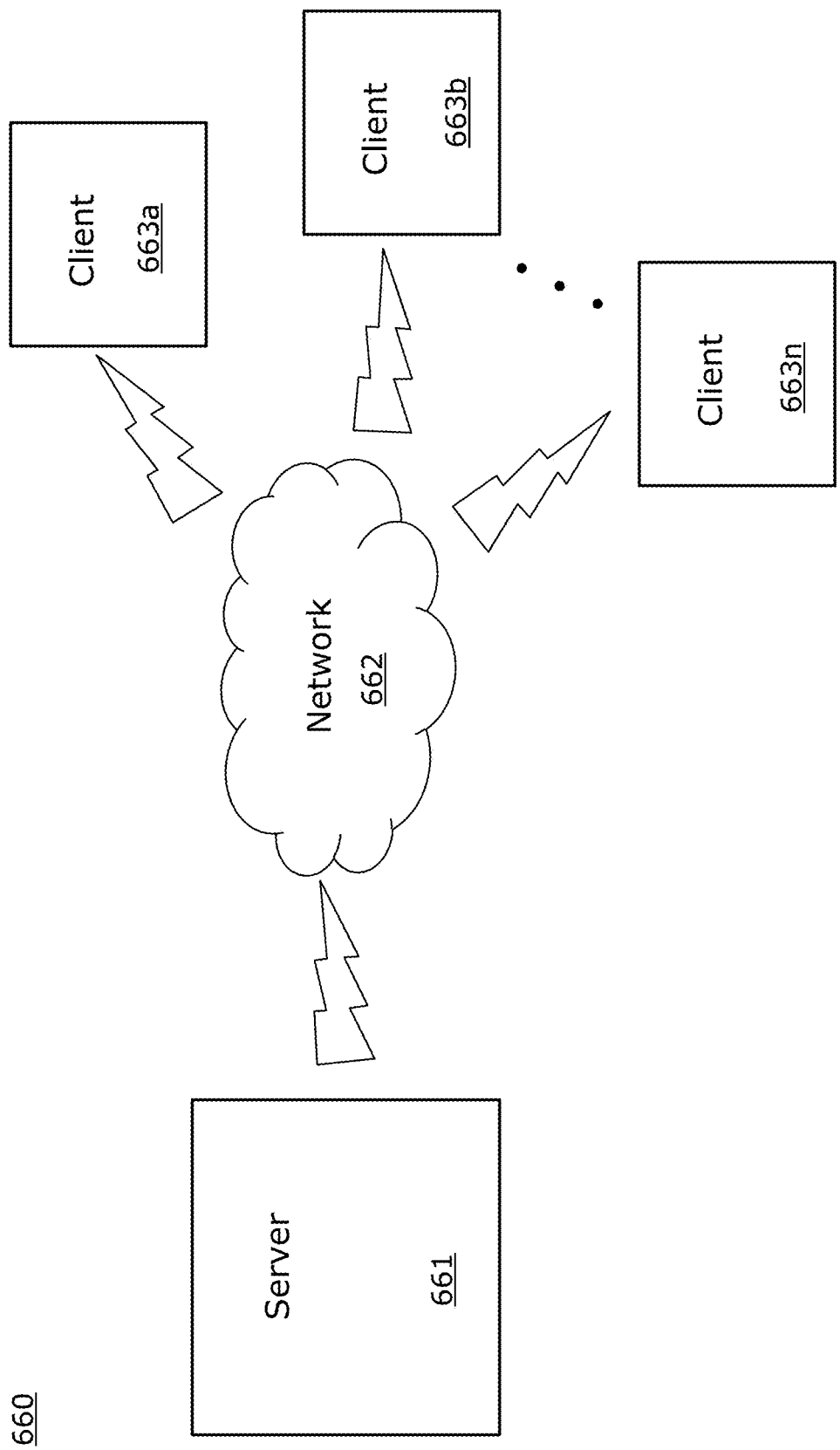
Figure: 6

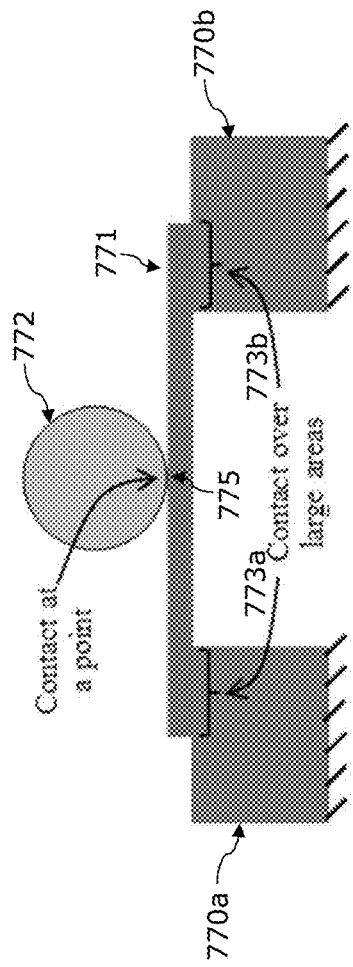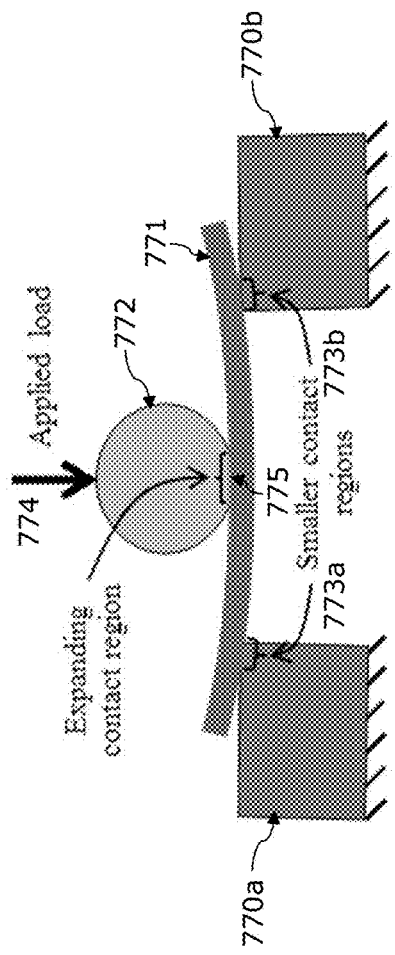
Figure: 7A
Figure: 7B

INTRA-INCREMENT ADJUSTMENTS OF IMPLICIT FINITE ELEMENT SIMULATION

BACKGROUND OF THE INVENTION

The invention generally relates to the field of computer programs and systems, and specifically to the field of computer aided design (CAD), computer-aided engineering (CAE), modeling, and simulation.

A number of systems and programs are offered on the market for the design of parts or assemblies of parts. These so called CAD systems allow a user to construct and manipulate complex three-dimensional models of objects or assemblies of objects. CAD systems thus provide a representation of modeled objects using edges or lines, in certain cases with faces. Lines, edges, faces, or polygons that make up models may be represented in various manners, e.g., non-uniform rational basis-splines (NURBS).

These CAD systems manage parts or assemblies of parts of modeled objects, which are mainly specifications of geometry. In particular, CAD files contain specifications, from which geometry is generated. From geometry, a representation is generated. Specifications, geometry, and representations may be stored in a single CAD file or multiple CAD files. CAD systems include graphic tools for representing the modeled objects to the designers; these tools are dedicated to the display of complex objects—the typical size of the file representing an object in a CAD system ranges, but is typically on the megabyte order of magnitude for a part. An assembly may contain thousands of parts, and an assembly file is correspondingly large. A CAD system manages models of objects, which are stored in electronic files.

The advent of CAD and CAE systems allows for a wide range of representation possibilities for objects. One such representation is a finite element analysis (FEA) model. The terms FEA model, finite element (FE) model, finite element mesh, and mesh are used interchangeably throughout this application. A FE model typically represents a CAD model, and thus, may represent one or more parts or an entire assembly. A FE model is a system of points called nodes which are interconnected to make a grid, referred to as a mesh. The FE model may be programmed in such a way that the FE model has the properties of the underlying object that it represents. When a FE model is programmed in such a way, it may be used to perform simulations of the object that it represents. For example, a FE model may be used to represent the interior cavity of a vehicle, the acoustic fluid surrounding a structure, and any number of real-world objects, including medical devices such as stents. When a given FE model represents an object and is programmed accordingly it may be used to simulate the real-world object itself. For example, a FE model representing a stent may be used to simulate the use of the stent in a real-life medical setting.

The usefulness of a finite element simulation however is limited by the accuracy of the simulation. For example, a common error in finite element simulations is penetration, i.e., the simulation generating a result indicating that a surface of a FE model has been breached or has breached the surface of a component of the FE model or the surface of another FE model. While there are existing solutions to compensate for these errors, and thus enhance the accuracy of the finite element simulation, the existing solutions are inadequate.

For example, one such method to improve the accuracy of a finite element simulation is a non-default contact-constraint-enforcement option referred to herein as the "augmented penalty method." This method has some similarity to embodiments of the present invention, in that it mitigates effects of numerical approximations on a reported solution, through special treatment of certain iterations of a Newton iteration scheme. Specifically, the augmented penalty method combines a penalty constraint enforcement method with augmentations, as needed, to avoid reporting a solution in which the contact penetration observed in the reported solution exceeds a threshold value. The augmented penalty method option uses a reduced penalty stiffness relative to what is normally encouraged, and it only carries out augmentation if the threshold penetration is reached. Therefore, the augmented penalty method approach requires a challenging user judgment as to what level of penetration may influence stress solutions of interest. The augmented penalty method also has a disadvantage in that solutions accepted as converged may involve the combination of a positive contact pressure and positive gap distances at specific locations of the interface (especially during unloading), which is confusing and typically nonphysical.

Unfortunately, some documentation refers to the augmented penalty method described above as the "Augmented Lagrange method" which is confusing and inconsistent with terminology from academic literature. For example, the explanation of the "Augmented Lagrangian method" starting on page 328 of *Nonlinear Finite Elements for Continua and Structures*, Belytschko, Liu, and Moran, Wiley and Sons, 2000 is much different than the "augmented penalty method" described above (and much different than embodiments of the present invention).

Various stabilization methods have also been used in implicit finite element simulations in an attempt to improve the accuracy and efficiency of these simulations. For example, existing software suites for performing finite element simulations have included contact stabilization and other artificial stabilization features. These methods have not modified the stabilization coefficients across iterations of an increment of a finite element simulation. For example, at least some known contact stabilization features modify the stabilization coefficient across load increments, for example, to remove the stabilization altogether for the final load increment, but the coefficient was kept constant across all iterations associated with an increment of the finite element simulation.

SUMMARY OF THE INVENTION

Thus, a method of efficiently improving the accuracy of finite element simulation is needed. Embodiments of the present invention allow converged solutions of a finite element simulation to always correspond to having, for example, a high penalty stiffness, in effect, so the user can consistently rely on the results being accurate.

With the above mentioned augmented penalty method, the overall number of iterations performed for a given load increment can be excessively large and non-physical numerical effects will persist to some degree in reported solutions. Non-physical numerical effects with the augmented penalty method include contact penetrations of distances up to the penetration tolerance threshold and contact pressures occurring where a small gap exists between surfaces.

Embodiments of the present invention mitigate these errors and provide realistic nonlinear finite element simulations. The present invention allows the reported solution to be free of potential inaccuracies associated with numerical control settings (such as a finite contact (penalty) stiffness or nonzero contact stabilization stiffness) that may degrade accuracy. Thus, the invention can help to avoid tradeoffs between accuracy and robustness for simulations, and it can help to make realistic finite element simulation more accessible to non-expert users.

A method and corresponding system according to an embodiment of the present invention are directed to performing finite element simulations. An embodiment of the present invention begins by determining a first value of a parameter used by a finite element simulation of a load increment. Next, a first solution of the finite element simulation is determined by performing Newton iterations using the first value of the parameter until a first convergence check is satisfied. After determining the first solution, a second value of the parameter is determined. In such an embodiment, the second value of the parameter is unequal to the first value of the parameter. Finally, the method concludes by determining a second solution of the finite element simulation by continuing the Newton iterations using the second value of the parameter until a second convergence check is satisfied, the first convergence check being different than the second convergence check.

In an alternative embodiment of the present invention, the first and second convergence check may be equal. Yet further still, another embodiment comprises: determining a first value of a parameter used by a finite element simulation of a load increment, determining a first solution of the finite element simulation by performing Newton iterations using the first value of the parameter, determining a second value of the parameter used by the finite element simulation of the load increment, the second value of the parameter being unequal to the first value of the parameter, and determining a second solution of the finite element simulation by continuing the Newton iterations using the second value of the parameter.

According to an embodiment of the method, the parameter represents penalty stiffness or an artificial stabilization level. In yet another embodiment of the present invention, the method further comprises displaying or reporting the second solution. According to the principles of the present invention, the second value of the parameter may be determined by scaling the first value of the parameter.

In an alternative embodiment of the invention, the steps of the method are iterated for one or more load increments of the finite element simulation. According to such an embodiment, for each load increment being simulated a first value of the parameter is determined and a respective solution is found by performing Newton iterations until a first convergence check is satisfied. Next, a second value of the parameter is determined and again a second solution is calculated by continuing the Newton iterations that were performed for determining the first solution, similarly, until a second convergence check is satisfied. Thus, in such an embodiment the aforementioned steps are carried out for each load increment of the finite element simulation. In such an embodiment, the finite element simulation may comprise determining a first value, determining a first solution, determining a second value, and determining a second solution for any number of load increments.

Another embodiment of the invention comprises establishing control settings that are used in determining the first and second solutions. Similarly, in an embodiment of the invention wherein the steps are iterated for one or more load increments, such an embodiment may further comprise establishing respective control settings. In such an embodiment, the established control settings may remain constant during the finite element simulation of each respective load increment, and the solutions to the finite element simulation for each respective load increment may be determined using the control settings in addition to the first and second values of the parameter.

According to an embodiment of the present invention, the first and second checks comprise performing a convergence check for each respective Newton iteration that is performed when determining each solution. In yet another embodiment, the method may further comprise performing the finite element simulation for a different load increment if a respective convergence check fails. In an embodiment, the first and second convergence checks are a repeatedly done when determining the first and second solutions. However, in an alternative embodiment of the present invention, the first and second convergence checks are only performed intermittently when performing the Newton iterations to determine the first and second solutions. According to an embodiment of the present invention, the first convergence check is relaxed relative to the second convergence check. Yet further still, an embodiment of the method further comprises determining one or more subsequent values of the parameter and determining one or more respective solutions by continuing the Newton iterations using the one or more subsequent values of the parameter until respective convergence checks are satisfied.

An alternative embodiment of the present invention is directed to a system for performing finite element simulation. According to such an embodiment, the system comprises a parameter module configured to determine a first value of a parameter and a second value of the parameter. In such an embodiment of the system, the parameter is used to perform a finite element simulation of a load increment and the second value of the parameter is unequal to the first value of the parameter. An embodiment of the system further comprises a solution module that is communicatively coupled to the parameter module and configured to determine a first solution of the finite element simulation by performing Newton iterations using the first value of the parameter until a first convergence check is satisfied. Further, the solution module is configured to determine a second solution of the finite element simulation by continuing the Newton iterations using the second value of the parameter until a second convergence check is satisfied, the first convergence check being different than the second convergence check. According to an embodiment of the system, the parameter may represent penalty stiffness or an artificial stabilization level.

In yet another embodiment, the system further comprises a reporting module configured to display the second solution. According to yet another embodiment of the system, the parameter module is configured to determine the second value of the parameter by scaling the first value of the parameter.

In an alternative embodiment of the system, the respective modules of the system are configured to operate iteratively for one or more load increments of the finite element simulation. In such an embodiment, the system may further comprise a control settings module configured to establish respective control settings that remain constant during the finite element simulation of a respective load increment. Further, the solutions module may be configured to determine the respective solutions to the finite element simulation using the respective established control settings in addition to the respective values of the parameter.

According to yet another embodiment of the system, the respective modules are configured to perform the finite element simulation for another load increment if the first or second convergence check fails. In yet another embodiment of the present invention, the solutions module is configured to determine the first and second solutions by repeatedly performing the Newton iterations until the first and second convergence checks are satisfied.

In yet another embodiment of the system, the first convergence check is relaxed relative to the second convergence check. According to an alternative embodiment of the invention, the parameter module may be further configured to determine one or more subsequent values of the parameter. Further, in such an embodiment, the solutions module is further configured to determine one or more respective solutions by continuing the Newton iterations using the one or more subsequent values of the parameter until respective convergence checks are satisfied.

Another embodiment of the present invention is directed to a cloud computing implementation for performing finite element simulations. Such an embodiment is directed to a computer program product executed by a server in communication across a network with one or more clients. The computer program product comprises a computer readable medium that comprises program instructions which, when executed by a processor, causes: determining a first value of a parameter used by a finite element simulation of a load increment, determining a first solution of the finite element simulation by performing Newton iterations using the first value of the parameter until a first convergence check is satisfied, determining a second value of the parameter used by the finite element simulation of the load increment, the second value of the parameter being unequal to the first value of the perimeter, and determining a second solution to the finite element simulation by continuing the Newton iterations using the second value of the parameter until a second convergence check is satisfied, the first convergence check being different than the second convergence check.

Similarly to other embodiments of the invention, the parameter in such an embodiment may represent penalty stiffness or an artificial stiffness level. In yet another embodiment of the present invention, the computer program product comprises program instructions which when executed by the processor further causes displaying the second solution. Yet further still, in an embodiment of the present invention directed to a cloud computing implementation, the computer readable medium may further comprise program instructions wherein determining the second value of the parameter comprises scaling the first value of the parameter.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 1 is a flow chart depicting a method of performing a finite element simulation according to principles of the present invention.

FIG. 2A is a simplified diagram of a finite element model of a fixed beam that may be used in a finite element simulation that utilizes principles of the present invention.

FIG. 2B is a simplified diagram of a finite element model of a fixed beam under tip loading that may be used in a finite element simulation according to principles of the present invention.

FIG. 2C is a plot of force (tip loading) vs. displacement of the beam depicted in FIG. 2B.

FIG. 3A is a simplified diagram of a loop structure of performing a finite element simulation according to an embodiment of the present invention.

FIG. 3B is a simplified diagram of a loop structure of performing a finite element simulation that does not utilize principles of the present invention.

FIG. 4 is a flow chart diagram of a procedure for performing a finite element simulation according to an embodiment of the present invention.

FIG. 5 is a simplified block diagram illustrating a system according to the principles of the present invention.

FIG. 6 is a simplified diagram of a computer network environment in which an embodiment of the present invention may be embodied.

FIG. 7A is a simplified diagram of finite element models that may be used in a finite element simulation carried out according to the principles of the present invention.

FIG. 7B is a simplified diagram of finite element models that may be used in a finite element simulation carried out according to principles of the present invention.

DETAILED DESCRIPTION OF THE INVENTION

A description of example embodiments of the invention follows.

The teachings of all patents, published applications and references cited herein are incorporated by reference in their entirety.

The present invention allows for a more efficient determination of an accurate solution to a finite element simulation. Embodiments of the present invention include the possibility of precise strict enforcement of contact constraints, unlike the augmented penalty method, which is described hereinabove. While example embodiments described herein are discussed as being used in a finite element simulation to improve contact finite element simulations, embodiments of the present invention are not so limited. The principles behind Applicant's approach to finite element simulation can be applied to features other than the contact constraint enforcement method, such as artificial stabilization methods, to benefit from these methods' positive attributes, e.g. improved convergence, without suffering from their drawbacks, e.g. degraded accuracy.

FIG. 1 is a flow diagram of a method 100 for performing a finite element simulation according to the principles of the present invention. The method 100 begins by determining a first value of a parameter used by a finite element simulation of a load increment (101). The value of the parameter may be determined according to principles as are known in the art. Further, in an embodiment of the method 100, the first value of the parameter may be chosen primarily to robustly determine an approximate, but not necessarily highly accurate solution and the second value of the parameter determine in step 103, may be determined primarily based on accuracy considerations. Further, the value of the parameter may be determined as described hereinbelow in relation to FIG. 4. The parameter may be any parameter used in the finite element simulation. For example, the parameter may represent penalty stiffness or an artificial stabilization level.

According to an embodiment of the method 100, the parameter is associated with an algorithm that is used in computing the finite element simulation.

As described hereinabove the method 100 performs a finite element simulation of a load increment. Thus, the finite element simulation simulates the effect of a load on, for example, a finite element model. While having countless different possible implementations, in a simple implementation of the present invention such an embodiment simulates tip loading on a fixed beam. In such an example, the finite element simulation may determine the deformation caused by the force at the tip of the beam. According to such an embodiment, the solutions to the finite element simulation may be the solutions required to yield a state of equilibrium caused by the tip loading on the beam. An example embodiment of performing a finite element simulation of tip loading on a fixed beam is described hereinbelow in relation to FIGS. 2A-2C.

When simulating, for example, the loading on a beam, embodiments of the present invention may perform the finite element simulation of said loading in increments. Thus, the method 100 begins by determining a first value of a parameter used by a finite element simulation of a load increment (101). In such an embodiment, the method 100 may be performed for multiple load increments and the simulation stopped when all of the load increments have been simulated. According to such an embodiment, the load increments may remain constant across iterations of the method 100. However, in another embodiment of the method 100, the load increments are varied for each iteration of the method 100. According to another embodiment of the invention, the load increment may be the entire load to be simulated.

As described hereinabove, the parameter determined in step 101 of the method 100 may be a penalty stiffness parameter. In such an embodiment, the penalty stiffness may be multiplied by a penetration distance to determine the contact force to resist further penetration. In an example embodiment that performs a finite element simulation of a force on a beam, the penalty stiffness may be used to determine the contact force needed to stop the beam from penetrating a surface the beam contacts due to the force applied to the beam in the simulation.

After determining the first value of the parameter (101), the next step of the method 100 is to determine a first solution of the finite element simulation by performing Newton iterations using the first value of the parameter until a first convergence check is satisfied (102). In such an embodiment of the method 100, the Newton iterations are performed according to principles as are known in the art. Further detail regarding convergence checks is described hereinbelow.

Next, the method 100 continues by determining a second value of the parameter used in the finite element simulation of the load increment (103). According to an embodiment of the invention, the second value of the parameter is unequal to the first value of the parameter. Yet further still, in an embodiment of the invention, the second value of the parameter is determined by scaling the first value of the parameter.

The method 100 concludes by determining a second solution of the finite element simulation by continuing the Newton iterations using the second value of the parameter until a second convergence check is satisfied, the first convergence check being different than the second convergence check (104). According to an embodiment of the method 100, the Newton iterations at step 102 of the method 100 are stopped when the first solution is determined. Then, in step 104, the Newton iterations that were stopped at step 102 are continued from the stopping point until a second solution of the finite element simulation is determined. While described herein as solutions to the finite element simulation, the first and second solutions may be incremental solutions to the simulation. For example, the first solution may be a solution to the finite element simulation for the given load increment that was determined using the first value of the parameter. However, this may not be the final value of the load or the parameter, and thus the first solution may simply be an intermediate solution to the finite element simulation. In an embodiment of the method 100, the steps 101 through 104 are performed, and possibly iterated, with the respective solutions approaching the final solution of the finite element simulation of the load.

As described hereinabove, the first convergence check and the second convergence check may be different according to an embodiment of the invention. This difference may be the standard of convergence that the respective check requires, e.g., the first convergence check may have a more relaxed standard for convergence than the second convergence check. However, in an alternative embodiment of the method 100, the first and second convergence checks may be identical, e.g., the may have the same standard of convergence.

The method 100, as illustrated in FIG. 1, determines a first value of the parameter and a first solution and a second value of the parameter and a second solution. However, in an alternative embodiment of the method 100, further steps may be taken where a third value of the parameter is determined and a third solution to the finite element simulation of the load increment is determined by continuing the Newton iterations that were performed to determine the second solution. Embodiments of the method 100 may continue accordingly and determine any number of parameter values and solutions for a given load increment. In such an embodiment of the method 100, the method 100 continues after step 104 to determine the next value of the parameter and the next solution according to the principles of the method 100. In such an embodiment, the criteria for continuing the method 100 for any number of subsequent values of the parameter may be determined by a person of ordinary skill in the art and/or automated heuristics. Furthermore, in such an embodiment of the method 100, the initial parameter settings may be chosen primarily to robustly find an approximate, but not necessarily highly accurate solution. However, the value of the parameter may change changed throughout the process to yield increasing accurate solutions. Further, the final setting of a parameter for a given load increment may be chose primarily based upon accuracy considerations. In such an embodiment, the parameter values needed to improve accuracy may be chosen according to principles as are known in the art.

In yet another embodiment of the method 100, the steps 101-104 of the method are repeated, i.e., iterated, for another load increment. As described herein, this allows the finite element simulation of a load to be performed incrementally. In such an embodiment of the method 100, the steps 101-104 are carried out for multiple load increments and thus simulate increasing the load that is being simulated by the given load increments. The method 100 is performed in such a way, i.e., in several increments, so as to robustly and accurately determine a solution to the finite element simulation. As is known in the art it may be difficult to perform a finite element simulation of a load at once. Thus, embodiments of the present invention may perform a finite element simulation of a load in one or more increments to eventually simulate the entire load.

According to an alternative embodiment of the method 100, after determining a second solution of the finite element simulation (104), the method 100 may further comprise reporting the second solution. In yet another embodiment of the present invention, the first solution, determined in step 102, may be reported before determining a second value of the parameter and/or the second solution. In yet another embodiment of the method 100, the first and/or second solutions may be reported by writing the solutions to one or more files. In yet another embodiment of the present invention, the solutions may be displayed or reported via a communications network such as a local area network (LAN) or wide area network (WAN). In an example embodiment, the method 100 may be executed by a computer running appropriate software and the solutions may be reported to any point that is communicatively coupled to the computer executing the method 100 according to principles as are known in the art. Furthermore, embodiments of the method 100 are not limited to only reporting the first and second solutions, and in an alternative embodiment of the invention any value that is determined throughout performing the method 100 may be reported via the methods described hereinabove. For example, the first value of the parameter and the second value of the parameter may be written to a file that is accessible by a user performing the finite element simulation. Similarly, the parameter values and/or solutions may be displayed on a monitor communicatively coupled to a computer executing the method 100.

According to an embodiment of the present invention, the second value of the parameter may be determined in step 102 of the method 100 by scaling the first value of the parameter. For example, if the first value of the parameter is 0.5, the second value of the parameter may be determined by scaling the first value of the parameter by 0.5 to yield the second value of the parameter to be 0.25.

An embodiment of the method 100 may further comprise determining control settings that remain constant during the finite element simulation of the load increment. In such an embodiment of the method 100, the first solution and the second solution are determined using the first value of the parameter and the control settings and the second value of the parameter and the control settings, respectively. In an embodiment of the method 100 where the steps 101 through 104 are iterated for one or more load increments, respective control settings that remain constant during the finite element simulation of each respective load increment may be determined and similarly, the respective solutions may be determined using the respective control settings.

According to an embodiment of the method 100, when determining a first solution of the finite element simulation by performing Newton iterations, the Newton iterations are performed until a first convergence check is satisfied (102). Similarly, in such an embodiment, a second convergence check may also be performed when determining the second solution (104). In such an embodiment, the method 100 may restart at step 101 and perform the finite element simulation for another load increment if the first and/or second convergence checks fails. In an embodiment of the present invention, the first and second convergence checks are made for each Newton iteration performed in steps 102 and 104, and the Newton iterations are stopped when the convergence check is satisfied. In yet another embodiment, the first and second convergence checks are performed for a subset of the Newton iterations.

While the method 100 determines a first value of a parameter (101) and a second value of the same parameter (103), alternative embodiments of the method 100 may be performed for multiple parameters. In such an embodiment, a first value is determined for a first parameter and a second value is determined for the first parameter. In parallel, a first value is determined for a second parameter and a second value is determined for that same second parameter. Thus, the steps 101-104 may be carried out for multiple parameters, and the first solution and second solution may be determined using the respective values of the first and second parameters. Further, embodiments of the method 100 may be performed for any number of parameters used by the finite element simulation.

As described hereinabove, the method 100 comprises determining a first value of a parameter (101) and determining a second value of the parameter (102).

While embodiments of the invention may be utilized to perform any finite element simulation, embodiments of the present invention may be particularly efficient at performing non-linear finite element simulations. For example, only one Newton iteration is required to converge to a solution in a finite element simulation with a purely linear response that does not utilize principles of the present invention. Similarly, finite element simulations with a moderately non-linear response typically converge to a solution after only a few Newton iterations, again in a method that does not utilize principles of the present invention. Thus, applying the principles of the present invention in such cases with linear or only moderately non-linear responses may cause an increase in the total number of Newton iterations associated with a load, thereby degrading the efficiency of the finite element simulation without increasing the accuracy.

FIG. 2A is a simplified diagram of a finite element model of a beam 205 that may be used in a finite element simulation implementing the method 100 described hereinabove. In such a finite element simulation, the beam 205 undergoes tip loading, depicted as the force 206. FIG. 2B depicts the beam 205 after the tip loading 206 has caused the beam 205 to contact a surface 207. When the beam 205 contacts the surface 207, the finite element simulation of the beam 205 must properly handle the non-linear response. The response of the beam 205 under the tip loading 206 is shown in the plot of FIG. 2C. The response of the beam as the tip loading 206 increases is initially quite smooth, as shown by the portion 208 of FIG. 2C, although there is some non-linearity due to rotational effects and the fact that the tip load becomes a bit closer to the root end after deformation. However, at the point of contact, there is a sharp kink at point 209 of FIG. 2C, which corresponds to when contact first occurs between the beam 206 and the rigid surface 207. This kink 209 represents an instance of a strong non-linearity in structural response due to contact. However, after this initial contact, the response is more linear as the tip of the beam 205 is compressed, as shown by section 210 of FIG. 2C. Embodiments of the present invention, such as the method 100, may be used to perform a finite element simulation of the strong non-linearity, 209. Further, while the FIGS. 2A-2C illustrate a simple implementation of the principles of the present invention, embodiments of the present invention may greatly simplify and improve the efficiency of finite element simulations with strong non-linearity compared to existing methods known in the art.

While the non-linear interaction depicted in FIG. 2B is contact, embodiments of the present invention are not so limited and may be utilized to efficiently determine finite element simulation with non-linear responses by any cause as is known in the art, for example, material non-linearity and/or geometric non-linearity.

FIGS. 7A and 7B illustrate finite element models at two stages of a finite element simulation that may be carried out using principles of the present invention. FIG. 7A illustrates the initial stage of a finite element simulation. At this initial stage, a beam 771 is on two supports 770a and 770b, and a sphere 772 is atop the beam 771. At the initial stage depicted in FIG. 7A the contact areas 773a and 773b between the beam 771 and the supports 770a and 770b are large. In contrast, at the initial stage the contact area 775 between the sphere 772 and the beam 771 is small. FIG. 7B depicts the finite element models of FIG. 7A as a load, i.e., force, 774 is applied to the sphere 772. As the load 774 is applied to the sphere 772, the sphere 772 is deformed and the contact area 775 between the sphere 772 and the beam 771 expands. Conversely, as the load 774 is applied to the sphere 772, the contact areas 773a and 773b between the supports 770a and 770b and the beam 771 become smaller. Performing a finite element simulation of applying the load 774 which causes the contact areas 775, 773a, and 773b to change size may be extremely difficult if carried out using traditional finite element simulation methods. However, if one were to use principles of the present invention, such as the methods 100, 320, or 440 described herein, the finite element simulations of the loading 774 may be performed more efficiently and accurately.

FIG. 3A is a simplified diagram of a loop structure 320 for performing a finite element simulation that utilizes principles of the present invention. FIG. 3A illustrates how Applicant's invention could affect the loop structure of software that may be used to perform an embodiment of the present invention. The loop structure 320 may be implemented in software according to principles as are known in the art. Furthermore, the software may be executed by any known computing device.

The loop structure 320 is comprised of three loops. The outermost loop, 321, is used to apply load increments and establish control settings. The next loop, 322, is used to adjust penalty stiffness, and the inner loop, 323, performs Newton iterations. The loop structure 320 begins with the outer loop 321. In the outer loop 321, a first load increment is determined and control settings are established that remain constant during the finite element simulation of the determined load increment. After establishing a load increment in the outer loop 321, a penalty stiffness is established in the loop 322. The penalty stiffness established in the loop 322 is used for the next series of Newton iterations performed in the loop 323. While the illustrated loop structure 320 adjusts penalty stiffness in the loop 323, the value of any parameter associated with the finite element simulation of the load increment may be adjusted in the loop 322. Further, in another embodiment of the loop structure 320, the value of multiple parameters may be adjusted in the loop 322.

After establishing the penalty stiffness in the loop 322, Newton iterations are performed in the loop 323. In the loop 323, Newton iterations are performed and a convergence check is made for each Newton iteration. If the Newton iterations converge, the standard of which may be set according to principles as are known in the art, the loop 323 is exited, and the process returns to the loop 322. However, if the Newton iterations diverge, the attempt at applying this load increment is aborted, the loop 323 is exited and the process returns to the outer loop 321. If the process returns to the loop 321 in this way, a different load increment to be applied is determined. However, if the convergence check is satisfied, a solution is reached and the next step is to return to the loop 322 to possibly adjust the penalty stiffness. In the loop 322, it is determined if there are any more adjustments needed to the penalty stiffness. If so, a new value of the penalty stiffness is determined and the process returns to the loop 323 to continue the Newton iterations as described herein. However, the loop 322 is exited and the process returns to the loop 321 if it is determined that no adjustments are needed to the penalty stiffness. According to an embodiment of the invention, the Newton iterations in the loop 322 are continued, i.e., begin where they left off for each change in the penalty stiffness. Thus, the first time the loop 322 is entered for a given load increment, the Newton iterations start anew, but when the loop 322 is entered after an adjustment in the parameter value only, caused by the loop 322, the Newton iterations are continued. Once returned to the loop 321, the results for the load increment are reported. In addition to reporting the results of the load increment, the process also determines if there is another load increment to apply. The process begins again and proceeds as described hereinabove if it is determined that no adjustments are needed to the penalty stiffness. If there is not another load increment, the process ends. While the loop structure 320 as depicted in FIG. 3A and described hereinabove varies the value of a penalty stiffness in the loop 322, embodiments the loop structure 320 are not so limited and any parameter as described herein may be varied in the loop 322.

The following is an example of carrying out an embodiment of the loop structure 320. One way of carrying out an embodiment of the present invention is to limit intra-increment adjustments to the value of the penalty stiffness to the first increment of an analysis, and for the user to prescribe a sequence of scale factors to apply to a default penalty stiffness. For example, the sequence of scale factors may be 0.0001, 0.01, and 1.0. In this case, the following logic would apply:

1. Determine a load increment of 0.2 in the loop 321.
2. Proceed to loop 322 and use a penalty stiffness scale factor of 0.0001.
3. Next, go to the inner loop 323 and use the penalty stiffness scale factor of 0.0001 in the Newton iterations until convergence checks based on force residuals and other measures are (nearly) satisfied.
4. Then, return to the loop 322 and change the penalty stiffness scale factor to 0.01.
5. Go back to the loop 323 and perform Newton iterations using the penalty stiffness scale factor of 0.01 until convergence checks are (nearly) satisfied.
6. Again, return to the loop 322 and change the penalty stiffness scale factor to 1.0.
7. Return to the loop 323 and perform Newton iterations until convergence checks are satisfied.
8. Exit the loop 323 and determine in the loop 322 that there are no further adjustments to the penalty stiffness.
9. Enter the loop 321 and accept and report the converged solution.
10. In the loop 321 determine if there is another load increment to be applied and if so, process subsequent load increments using a penalty stiffness scale factor of 1.0 for all iterations of those increments. In an alternative embodiment, the penalty stiffness scale factors are varied as described hereinabove for each load increment. In yet another embodiment, the penalty stiffness scale factors are varied as described hereinabove but, only for a subset of the active contact constraints, such as for newly established contacts.

A key aspect of an embodiment of the invention is that all iterations within an increment are based on incremental motion and changes to state relative to the beginning of the increment, which means that this technique is not heavily prone to inaccuracies associated with path dependence. This approach is effective for robustly and accurately resolving dramatic changes in contact status that are quite common upon initial loading. Use of a low penalty stiffness in early iterations helps to robustly find an approximate solution, and then an embodiment of the invention gradually switches to a stricter enforcement of contact constraints to robustly find an accurate solution.

Potential enhancements to this approach include:
a) Switching to a Lagrange multiplier method (or other strict contact-constraint enforcement method) in final iterations of a load increment.
b) Automatically detecting circumstances that call for reductions in the penalty stiffness scale factor in early iterations.
c) Automatically determining the amount by which the penalty stiffness scale factor should be reduced in early iterations.
d) Applying a similar technique when processing load increments other than the first load increment, for example, perhaps only for newly established contacts.
e) Adding heuristics to automatically reduce the penalty stiffness for the next series of Newton iterations if the current series of Newton iterations diverges.
f) Relaxing convergence criteria for Newton iterations prior to the last series of Newton iterations for a particular load increment.

For comparison, FIG. 3B illustrates a loop structure for performing a finite element simulation as is known in the prior art. FIG. 3B is a simplified diagram of a loop structure 330 for performing a finite element simulation. The loop structure 330 comprises the loop 331 and the loop 332. The outer loop 331 is used to determine the load increment, the penalty stiffness, and the control settings to be used for performing the finite element simulation of the respective load increment. The inner loop 332 performs Newton iterations using the determined penalty stiffness and control settings. The loop 322 as illustrated in FIG. 3A is absent from the loop structure 330. Thus, the loop structure 330 does not vary the penalty stiffness or other parameter when computing the finite element simulation for a given load increment. If one were to perform a finite element simulation using the loop structure 330, the method would begin by first determining a load increment, penalty stiffness, and other control settings to be used in the finite element simulation of the determined increment. Next, the process would proceed to loop 332 and carry out Newton iterations. However, unlike the loop structure 320, if the Newton iterations converge or diverge in the loop 332 the process returns to the outer loop 331. Unlike the loop structure 330, embodiments of the present invention may vary parameters such as a penalty stiffness as shown in the inner loop 322 of the loop structure 320 to more efficiently determine a solution for a given load increment.

FIG. 4 is a flowchart depicting a procedure of performing a finite element simulation according to an embodiment of the present invention. The method 440 begins by determining a load increment (441). Next, the value of a parameter to be in effect for Newton iterations is determined (442). After determining the value of the parameter (442), the Newton iterations are performed to determine a solution of a finite element simulation of the load increment using the determined value of the parameter (443). The next step of the method 440 is to determine if the Newton iterations converged to a solution (444). If it is determined that the Newton iterations converge to a solution at 444, the method 440 moves on to step 445. However, if the Newton iterations do not converge to a solution, the method 440 returns to step 441 and a new load increment is determined. Returning to step 441 from step 444 may be referred to as changing the size of a load increment. This terminology may be in contrast to the "next load increment." Returning to step 441 directly from step 444 is the result of the Newton iterations diverging, i.e., the current attempt at processing the load increment failing. However, returning to step 441 from step 447 (described below) means the simulation for the load increment has been successful and the method 440 is proceeding to the next load increment. This subtlety will be further illustrated hereinbelow when describing a numerical implementation of the method 440.

The value of the parameter determined at step 442, may be chosen according to principles known in the art. For example, in an embodiment wherein the parameter represents penalty stiffness, a contact penalty stiffness may be established based on a non-dimensional factor times an elastic modulus of the underlying material, that the finite element model represents, divided by a representative characteristic dimension of one or more underlying finite elements. In such an embodiment, the contact penalty stiffness may be multiplied by contact penetration distance to determine the contact pressure applied locally to the respective contact surfaces in the penetrating region. With traditional methods, the non-dimensional factor would be chosen, possibly automatically by software performing the method, such as to try to achieve a balance between being large enough to achieve an accurate solution with minimal penetrations while small enough to achieve reasonably good convergence characteristics. In an embodiment of the invention, another scale factor may also be set (and reset), for example at step 442 of the method 440. In such an example embodiment where the parameter represents penalty stiffness, the first setting of the parameter may be much less than 1.0 to improve convergence characteristics and subsequent setting of the parameter increased. If the final setting exceeds 1.0, the solution reported for the increment would be more accurate than with the traditional penalty method in which this additional scale factor essentially remains at 1.0 for all iterations.

According to an embodiment of the method 440, the convergence criteria used at step 444 may be varied throughout iterations of the method 440. For example, more tolerant convergence criteria may be used in earlier iterations of the method 440, and the convergence criteria may be tightened as iterations of the method 440 are performed. In such an embodiment, relaxed convergence criteria may be used if it is anticipated that further adjustments to the parameter are going to be made. Yet further still, relaxed convergence criteria may be used when performing earlier Newton iterations for a given load increment, and the convergence criteria may be made more stringent as processing for the given load increment continues. However, in an alternative embodiment the convergence criteria may be equal throughout iterations of the method 440. In another embodiment of the method 440, steps 443 and 444 may be performed together, such that a convergence check is performed each time a Newton iteration is carried out.

Returning to step 444 of the method 440, if it is determined that the solution converges at step 444, the method 440 proceeds to determine if it is necessary to adjust the value of the parameter (445). The method 440 returns to step 442 to determine the value of the parameter to be in effect for the next series of Newton iterations if it is determined that the value of the parameter should be adjusted at 445. When the method 440 returns to step 442, the method 440 proceeds as described hereinabove. If it is determined at step 445 that the value of the parameter does not need to be adjusted, the method 440 proceeds to report the solution (446). This reported solution represents a solution to the finite element simulation for the load increment that was determined at step 441. The solution may be reported via any means as is known in the art. For example, the solution may be reported by displaying the solution or writing the solution to a file.

The next step in the method 440 is to determine if there is another load increment (447). If there is another load increment to apply, the method 440 returns to step 441. If however it is determined to not perform the finite element simulation for another load increment the method ends (448).

While the solution is reported at step 446, in an alternative embodiment of the method 440, solutions may be reported throughout the method 440. For example, a solution may be reported after performing the Newton iterations and finding a converging solution at step 443. Yet further still, in another embodiment, a non-converging solution is reported. In yet another embodiment, output may be provided after every step of the method 440. According to yet another embodiment, a solution is not reported until after it is determined at step 447 that there are no more load increments to be applied.

Described hereinbelow is an example use of the method 440 to perform a finite element simulation of loading. The method begins by determining a load increment of 0.2 at step 441. Next, the value of a parameter to be in effect for the Newton iterations is determined (442). For example, this may be 0.5. Next, Newton iterations are performed to determine a solution of the finite element simulation of the load increment of 0.2 using the parameter value of 0.5 (443). Next, a convergence check is performed (444). Assuming that the solution converges, the method 440 proceeds to determine if the value of the parameter needs to be adjusted (445). Assuming for the sake of simplicity, that it is determined at step 445 to not adjust the value of the parameter, the method 440 moves on to report the solution (446). Next, a determination is made if another load increment should be simulated (447). If it is determined that another load increment should be simulated at 447, the method returns to step 441 to determine a next load increment. At 441, again assume that the load increment is 0.2, thus, the finite element simulation is going to simulate a total loading of 0.4. If it is determined at 441 that the new load increment is 0.2, then the method proceeds through the steps 442-446 as described hereinabove and determines a solution to the finite element simulation with a total loading of 0.4. Then, again assuming that after step 447 the method 440 returns to step 441 to determine the next load increment, then the load increment may be 0.2 thereby attempting to simulate a total loading of 0.6. However, in this example, at step 444 the solution does not converge. At this point the method 440 returns to step 441 and determines a third load increment to simulate. This may be referred to herein as changing the size of a load increment. At this point the load increment may be lowered, for example to 0.1, to continue the finite element simulation. The method 440 now carries out a second attempt at a third load increment. The second attempt at the third load increment of 0.1 is carried out, this time successfully and the method 440 returns to step 441. This process may continue successfully until for example, a total load of 1 is applied.

Embodiments of the present invention can also be applied to artificial stiffnesses, dampers, or inertia-like terms which may be introduced in an implicit finite element analysis to improve convergence behavior (i.e., robustness) but which are not physically motivated. Without the present invention, a finite element software user may sometimes be left with a choice between a simulation without artificial stabilization methods that does not converge, i.e., does not report a solution, or a simulation with artificial stabilization methods that converges to a non-physical, i.e., misleading result. With the present invention, for example, an artificial stiffness may be introduced in early iterations, and eventually removed or reduced to a very small number in final iterations for a load increment. The main purpose of the early iterations is to find an approximate solution and the final iterations hone in on an accurate solution, which may be reported to the simulation analyst. A solution may be reported through any means of communication known in the art. For example, a solution may be displayed in a graphical user interface to a user or written to a file which can be accessed by the simulation analyst. Furthermore, embodiments of the invention may report any result generated in carrying out any of the methods described herein.

FIG. 5 is a simplified block diagram of a computer-based system 550 which may be used to perform a finite element simulation according to the principles of the present invention. The system 550 comprises a bus 555. The bus 555 serves as an interconnect between the various components of the system 550. Connected to the bus 555 is an input-output device interface 558 for connecting various input and output devices such as a keyboard, mouse, display, speakers, etc. to the system 550. Central processing unit 552 is connected to the bus 555 and provides for the execution of computer instructions. Memory 557 provides volatile storage for data used for carrying out computer instructions. Storage 556 provides non-volatile storage for software instructions such as an operating system (not shown). The system 550 also comprises a network interface 551 for connecting to any variety of networks, including WANs and LANs. Further connected to the bus 555 is a parameter module 553. The parameter module 553 may be configured to determine a first value of a parameter and a second value of the parameter used by a finite element simulation of a load increment. Communicatively coupled to the parameter module 553 is a solution module 554. The solution module 554 is configured to determine a first solution of the finite element simulation by performing Newton iterations using the first value of the parameter. The solution module 554 is also further configured to determine a second solution of the finite element simulation by continuing the Newton iterations using the second value of the parameter.

The system 550 and its various modules may be configured to carry out any embodiments of the present invention as described herein. According to an embodiment of the invention, the system 550 determines the first value of a parameter used by a finite element simulation of a load increment via the parameter module 553. The parameter module 553 is further configured to determine a second value of the parameter. The first and second value of the parameter is communicated to the solution module 554. The solution module 554 determines a first solution of the finite element simulation by performing Newton iterations using the first value of the parameter. Next, the solution module 554 determines a second solution of the finite element simulation by continuing the Newton iterations using the second value of the parameter. In another embodiment of the system 550, the parameter module 553 determines the first value of the parameter and communicates this first value to the solutions module 554. Then, the solutions module 554 determines the first solution. Next, the parameter module 553 determines the second value of the parameter and again the second solution is determined by the solution module 554 as described herein.

According to another embodiment of the system 550, the modules as described herein may be software modules that may be executed by a processor, such as the CPU 552. In an alternative embodiment, the system 550 comprises a reporting module configured to display the second solution. The reporting module of the system 550 may be further configured to report any of the results of any of the processes carried out by the system 550. Alternatively, the system 550 may report solutions via the network interface 551 and/or input-output device interface 558. According to alternative embodiment of the system 550, the parameter module 553 may be configured to determine the second value of the parameter by scaling the first value of the parameter. In yet another embodiment of the system 550, the respective modules of the system 550 may be configured to operate iteratively for one or more load increments of the finite element simulation. In yet another alternative embodiment, the system 550 comprises a control settings module configured to establish respective controls settings that remain constant during the finite element simulation of a respective load increment. In such an embodiment, the solution module 554 may be configured to determine the respective solutions to the finite element simulation using both respective values of a parameter determined by the parameter module 553 and the established control settings.

In yet another embodiment, the solutions module 554 is further configured to perform respective convergence checks of the Newton iterations. In such an embodiment, the respective modules of the system 550 may be configured to perform the finite element simulation for another load increment if the convergence check fails. In yet another embodiment, the solutions module 554 is configured to determine the first and second solutions by repeatedly performing the Newton iterations until the respective convergence checks are satisfied. According to an embodiment of the system 550, the solutions module 554 is configured to determine a first solution of the finite element simulation by performing Newton iterations using the first value of the parameter until a first convergence check is satisfied. Similarly, in such an embodiment, the solution module 554 is configured to determine the second solution to the finite element simulation by continuing the Newton iterations using the second value of the parameter until a second convergence check is satisfied, where the first convergence check is different than the second convergence check. However, in yet another embodiment of the system 550, the first and second convergence checks may be the same.

Yet further still, according to an embodiment of the invention, the parameter module 553 is configured to determine one or more subsequent values of the parameter and the solutions module 554 is configured to determine one or more respective solutions by continuing the Newton iterations using the one or more subsequent values of the parameter until respective convergence checks are satisfied.

FIG. 6 illustrates a computer network environment 660 in which the present invention may be implemented. In the computer network environment 660, the server 661 is linked through communications network 662 to clients 663*a-n*. The environment 660 may be used to allow the clients 663*a-n*, alone or in combination with the server 661, to execute the methods described above.

It should be understood that the example embodiments described above may be implemented in many different ways. In some instances, the various methods and machines described herein may each be implemented by a physical, virtual, or hybrid general purpose computer, or a computer network environment such as the computer environment 660.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It also should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and, thus, the data processors described herein are intended for purposes of illustration only and not as a limitation of the embodiments.

While this invention has been particularly shown and described with references to example embodiments thereof, it will be understood by those skilled in the art that various changes in form and details may be made therein without departing from the scope of the invention encompassed by the appended claims.

What is claimed is:

1. A method of performing a finite element simulation of contact of a real-world object to design the real-world object, the method comprising:
   by one or more processors executing computer code instructions, simulating behavior of a real-world object represented by a finite element model subject to a total loading, the finite element simulation simulating the behavior of the real-world object subject to the total loading in a plurality of stages each corresponding to a load increment of a plurality of load increments, each stage of the finite element simulation incrementally changing loading conditions and including:
   determining a first value of a parameter used by the finite element simulation of a given load increment of the plurality of load increments;
   determining a first solution of the finite element simulation of the given load increment by performing a series of Newton iterations using and maintaining the first value of the parameter until a first convergence check is satisfied;
   determining a second value of the parameter used by the finite element simulation of the given load increment, thereby modifying the value of the parameter within the finite element simulation of the given load increment, the second value of the parameter being unequal to the first value of the parameter;

determining a second solution of the finite element simulation of the given load increment by continuing the series of Newton iterations using and maintaining the second value of the parameter until a second convergence check is satisfied, the first convergence check having a different required standard for convergence than the second convergence check, said continuing the series of Newton iterations to determine the second solution including starting the Newton iterations using the second value of the parameter at a next Newton iteration in the series of Newton iterations from where performing the Newton iterations using the first value of the parameter stopped and said determining the second solution resulting in execution of the finite element simulation simulating behavior of the real-world object, said execution of the finite element simulation determining loading behavior of the real-world object and contact behavior of the real-world object due to loading; and modifying the finite element model of the real-world object based on a result of the execution of the finite element simulation such that the modified finite element model more accurately represents loading and contact behavior of the real-world object.

2. The method of claim 1 wherein the parameter represents:
a penalty stiffness; or
an artificial stabilization level.

3. The method of claim 1 further comprising:
displaying the second solution.

4. The method of claim 1 wherein determining a second value of the parameter comprises scaling the first value of the parameter.

5. The method of claim 1 wherein the determining a first value, determining a first solution, determining a second value, and determining a second solution are iterated for one or more load increments of the finite element simulation.

6. The method of claim 5 further comprising:
establishing respective control settings that remain constant during the finite element simulation of a respective load increment; and
wherein respective solutions to the finite element simulation are determined using the respective established control settings.

7. The method of claim 1 further comprising:
performing the finite element simulation for another load increment if the first or second convergence check fails.

8. The method of claim 1 wherein the standard for convergence for the first convergence check is relaxed relative to the standard for convergence for the second convergence check.

9. The method of claim 1 further comprising:
determining one or more subsequent values of the parameter; and
determining one or more respective solutions by continuing the Newton iterations using the one or more subsequent values of the parameter until respective convergence checks are satisfied.

10. A system for performing a finite element simulation of contact of a real-world object to design the real-world object, the system comprising:
a memory with computer code instructions stored thereon, the memory coupled to one or more processors, and the computer code instructions being configured to cause the system to simulate behavior of a real-world object represented by a finite element model subject to a total loading, the finite element simulation simulating the behavior of the real-world object subject to the total loading in a plurality of stages each corresponding to a load increment of a plurality of load increments, each stage of the finite element simulation incrementally changing loading conditions and implementing:

a parameter module configured to determine a first value of a parameter and a second value of the parameter used by the finite element simulation of a given load increment of the plurality of load increments, thereby modifying the value of the parameter within the finite element simulation of the given load increment, the second value of the parameter being unequal to the first value of the parameter;

a solution module communicatively coupled to the parameter module and configured to determine a first solution of the finite element simulation of the given load increment by performing a series of Newton iterations using and maintaining the first value of the parameter until a first convergence check is satisfied;

the solution module further configured to:
determine a second solution of the finite element simulation of the given load increment by continuing the series of Newton iterations using and maintaining the second value of the parameter until a second convergence check is satisfied, the first convergence check having a different required standard for convergence than the second convergence check, said continuing the series of Newton iterations to determine the second solution including starting the Newton iterations using the second value of the parameter at a next Newton iteration in the series of Newton iterations from where performing the Newton iterations using the first value of the parameter stopped and said determining the second solution resulting in execution of the finite element simulation simulating behavior of the real-world object, said execution of the finite element simulation determining loading behavior of the real-world object and contact behavior of the real-world object due to loading; and modify the finite element model of the real-world object based on a result of the execution of the finite element simulation such that the modified finite element model more accurately represents loading and contact behavior of the real-world object.

11. The system of claim 10 wherein the parameter represents:
a penalty stiffness; or
an artificial stabilization level.

12. The system of claim 10 further comprising:
a reporting module configured to display the second solution.

13. The system of claim 10 wherein the parameter module is configured to determine the second value of the parameter by scaling the first value of the parameter.

14. The system of claim 10 wherein the respective modules are configured to operate iteratively for one or more load increments of the finite element simulation.

15. The system of claim 14 further comprising:
a control settings module configured to establish respective control settings that remain constant during the finite element simulation of a respective load increment; and wherein the solution module is configured to determine the respective solutions to the finite element simulation using the respective established control settings.

16. The system of claim 10 wherein:
the respective modules are configured to perform the finite element simulation for another load increment if the first or second convergence check fails.

17. The system of claim 10 wherein the standard for convergence for the first convergence check is relaxed relative to the standard for convergence for the second convergence check.

18. The system of claim 10 wherein:
the parameter module is further configured to determine one or more subsequent values of the parameter; and
the solutions module is further configured to determine one or more respective solutions by continuing the Newton iterations using the one or more subsequent values of the parameter until respective convergence checks are satisfied.

19. A computer program product executed by a server in communication across a network with one or more clients, the computer program product comprising:
a non-transitory computer readable medium, the computer readable medium comprising program instructions which, when executed by a processor causes performing a finite element simulation of contact of a real-world object to design the real-world object, wherein the real-world object is represented by a finite element model subject to a total loading, the finite element simulation simulating the behavior of the real-world object subject to the total loading in a plurality of stages each corresponding to a load increment of a plurality of load increments, each stage of the finite element simulation incrementally changing loading conditions and including:
determining a first value of a parameter used by the finite element simulation of a given load increment of the plurality of load increments;
determining a first solution of the finite element simulation of the given load increment by performing a series of Newton iterations using and maintaining the first value of the parameter until a first convergence check is satisfied;
determining a second value of the parameter used by the finite element simulation of the given load increment, thereby modifying the value of the parameter within the finite element simulation of the given load increment, the second value of the parameter being unequal to the first value of the parameter;
determining a second solution of the finite element simulation of the given load increment by continuing the series of Newton iterations using and maintaining the second value of the parameter until a second convergence check is satisfied, the first convergence check having a different required standard for convergence than the second convergence check, said continuing the series of Newton iterations to determine the second solution including starting the Newton iterations using the second value of the parameter at a next Newton iteration in the series of Newton iterations from where performing the Newton iterations using the first value of the parameter stopped and said determining the second solution resulting in execution of the finite element simulation simulating behavior of the real-world object, said execution of the finite element simulation determining loading behavior of the real-world object and contact behavior of the real-world object due to loading; and
modifying the finite element model of the real-world object based on a result of the execution of the finite element simulation such that the modified finite element model more accurately represents loading and contact behavior of the real-world object.

20. The computer program product of claim 19 wherein the parameter represents:
a penalty stiffness; or
an artificial stiffness level.

* * * * *